United States Patent
Haywood

(10) Patent No.: US 8,542,366 B2
(45) Date of Patent: Sep. 24, 2013

(54) SENSING COIL AND SENSING UNIT FOR SAGNAC OPTICAL FIBRE CURRENT SENSOR

(75) Inventor: John Haywood, East Gosford (AU)

(73) Assignee: Smart Digital Optics Pty Limited, Eveleigh, New South Wales (AU)

( * ) Notice: Subject to any disclaimer, the term of this patent is extended or adjusted under 35 U.S.C. 154(b) by 395 days.

(21) Appl. No.: 12/918,273

(22) PCT Filed: Feb. 20, 2009

(86) PCT No.: PCT/AU2009/000200
§ 371 (c)(1), (2), (4) Date: Sep. 9, 2010

(87) PCT Pub. No.: WO2009/103126
PCT Pub. Date: Aug. 27, 2009

(65) Prior Publication Data
US 2011/0051145 A1    Mar. 3, 2011

(30) Foreign Application Priority Data

Feb. 22, 2008 (AU) ................ 2008900844
Feb. 22, 2008 (AU) ................ 2008900845

(51) Int. Cl.
    *G01B 9/02*    (2006.01)
(52) U.S. Cl.
    USPC .................................... 356/483
(58) Field of Classification Search
    USPC .................................... 356/483
    See application file for complete search history.

(56) References Cited

U.S. PATENT DOCUMENTS

| 5,074,665 A | 12/1991 | Huang et al. |
| 5,677,622 A * | 10/1997 | Clarke ................... 324/96 |
| 6,301,400 B1 | 10/2001 | Sanders |
| 6,703,821 B2 | 3/2004 | Dyott |

FOREIGN PATENT DOCUMENTS

| JP | 2003227851 A | 8/2003 |
| WO | 00/36425 A2 | 6/2000 |
| WO | 01/63302 A2 | 8/2001 |
| WO | 03/023320 A1 | 3/2003 |

OTHER PUBLICATIONS

Blake, J., et al., In-Line Sagnac Interferometer Current Sensor, IEEE Transactions on Power Delivery, IEEE Service Center, Jan. 1, 1996; vol. 11: No. 1: 116-121.

* cited by examiner

*Primary Examiner* — Tarifur Chowdhury
*Assistant Examiner* — Jonathan Cook
(74) *Attorney, Agent, or Firm* — Polsinelli PC; Teddy C. Scott, Jr.; Ron Galant

(57) ABSTRACT

A sensing coil for a Sagnac interferometer current sensor is disclosed, the sensing coil (14) being composed of an optical fiber (for example a spun polarizing Hi-Bi fiber) that is arranged in use to transmit a single elliptical polarization state and the sensing coil comprising at least two interconnected loops (15 and 16 or 26 and 27 or 28 and 29). At least one of the loops is arranged in use to enclose a current conductor (11, 12 or 25) and the loops are interconnected such that light propagating in a first direction (23 or 30) in the first loop will propagate in a second, opposite, direction (24 or 31) in the other or, if more than one, in each other loop, whereby the sensing coil provides minimal sensitivity to rotational movement. Also disclosed are a sensing unit (FIG. 5) that incorporates the sensing coil and a current sensor (FIG. 1) that incorporates the sensing unit.

18 Claims, 3 Drawing Sheets

SENSING COIL AND SENSING UNIT FOR SAGNAC OPTICAL FIBRE CURRENT SENSOR

CROSS-REFERENCE TO RELATED APPLICATIONS

This is the national stage of International Application No. PCT/AU2009/000200, filed on Feb. 20, 2009, which claims the benefit of Australian Patent Application No. 2008900845, filed on Feb. 22, 2008 and Australian Patent Application No. 2008900844, filed on Feb. 22, 2008, the contents of all of which are incorporated herein by reference.

FIELD OF THE INVENTION

This invention relates to a sensing coil for use in a Sagnac interferometer optical fibre current sensor and, in alternative embodiments, to a current sensor incorporating such sensing coil, to a sensing unit incorporating the sensing coil and to a current sensor incorporating the sensing unit.

BACKGROUND OF THE INVENTION

Sagnac interferometer optical fibre current sensors of various types are well known. U.S. Pat. No. 5,677,622 granted to the University of Sydney as assignee of Ian G. Clarke discloses one such current sensor and it comprises a single sensing coil of spun single mode birefringent ("Hi-Bi") optical fibre that is in use located about a current conductor, typically a large-current carrying busbar. Counter-propagating light beams are launched into the coil by way of a 3×3 coupler and a measure of the magnitude of current flow is detected as the phase shift between polarisation modes of the counter-propagated light beams.

Current measuring by known Sagnac interferometers is adversely affected by rotational movement of the sensing coil about a normal to the plane of the coil and it has been determined by the Inventor that a small rotational movement (created, for example, by a 50 Hz or a 60 Hz mechanical vibration) can produce a large phase shift in polarisation modes relative to that produced by a change in magnetic field and, hence, current magnitude.

The present invention in its primary form seeks to provide a sensing coil winding that facilitates nullification, or at least partial nullification, of the effects of rotational movement; that is, a sensing coil that provides for minimal sensitivity to rotational movement.

SUMMARY OF THE INVENTION

Broadly defined, the present invention provides a sensing coil for a Sagnac interferometer current sensor, the sensing coil being composed of an optical fibre that is arranged in use to transmit a single elliptical polarisation state and the sensing coil comprising at least two interconnected loops. A first of the loops is arranged in use to enclose a current conductor and the loops are interconnected such that light propagating in a first direction in the first loop will propagate in a second, opposite, direction in the other or, if more than one, in at least one other loop.

The invention may also be defined as providing a Sagnac interferometer current sensor comprising: a sensing coil as above defined, a light source, a coupler interconnecting the light source and the sensing coil and arranged to launch counter-propagating light beams into the sensing coil, and a detector for detecting phase shift between polarisation modes of the counter-propagating light beams.

The optical fibre forming the sensing coil may optionally comprise an optical fibre that is annealed to relieve bending stress that is established with formation of the loops and be provided with end filters to enable in-use transmission of a single elliptical polarisation state. However, the optical fibre desirably comprises twisted and, most desirably, spun birefringent optical fibre; for example a spun bow-tie polarising fibre that has elliptical (i.e., approximately circular) birefringence sufficiently large as to swamp linear bending birefringence.

The sensing coil may optionally have n>2 loops, as below described, but in one embodiment has n=2 only loops. In this latter case both loops may optionally have the same number of turns and enclose equal-size areas. However, the coil may be wound in a manner such that:

$$N_1 \times A_1 = N_2 \times A_2, \text{ where}$$

$N_1$=number of turns in the first loop,
$A_1$=area enclosed by the first loop,
$N_2$=number of turns in the second loop and
$A_2$=area enclosed by the second loop.

The respective loops of the sensing coil may optionally be wound about (i.e., extend about) spatially separated parallel axes and, in the case of a coil having two only loops, the loops may be formed in a figure-of-eight winding. In an alternative arrangement, the respective loops of the sensing coil may be wound about a common axis and, in the case of a coil having two only loops, the loops may be wound concentrically (but in opposite directions) to form a substantially circular coil. In the latter case one loop may be sized to locate within the internal periphery of the other loop, or the two loops may be disposed in overlaying relationship.

In an embodiment in which the sensing coil is wound with two loops about spatially separated parallel axes, each of the coils may optionally be arranged in use to enclose a respective limb or conductor portion of a current conductor.

When the sensing coil is formed with n>2 loops (i.e., at least three loops), the first loop may be formed to enclose a single current conductor and the further loops may be wound as interconnected sub-loops about the perimeter of the first loop. In this case the sensing coil will be wound in a manner (as above defined) such that light propagating in a first direction in the first loop will be caused to propagate in the opposite direction in each of the sub-loops. Also in this case, the coil will be wound in a manner such that:

$$N_1 \times A_1 = \Sigma(N_2 \times A_2), \text{ where}$$

$N_1$=number of turns in the first loop,
$A_1$=area enclosed by the first loop,
$N_2$=number of turns in respective ones of the sub-loops and
$A_2$=area enclosed by respective ones of the sub-loops.

The sensing coils in accordance with the (various) above described embodiments may optionally be wound with their loops inclined to one another (i.e., separated by an angle other than 0 or 180 degrees) but, for optimum performance, the loops forming the respective coils desirably are disposed substantially in a common plane.

The current sensor as above defined may optionally comprise or include a sensing unit which is connectable in circuit with a current busbar and which itself comprises a carrier having two interconnected conductor portions that are arranged to be connected in series with the busbar. A sensing coil as above defined and having two loops is incorporated in the sensing unit with each loop enclosing a respective one of the conductor portions of the current conductor.

Thus, the invention in one of its embodiments may be further defined as providing a sensing unit for a Sagnac interferometer current sensor and which is connectable in circuit with a current busbar. The sensing unit comprises:

a) a carrier having first and second conductor portions that are arranged in use to be connected in series with the current busbar, and b) a sensing coil composed of optical fibre that is arranged in use to transmit a single elliptical polarisation state and which comprises interconnected first and second loops respectively enclosing the first and second conductor portions, the loops being interconnected such that light propagating in a first direction in the first loop will propagate in a second, opposite, direction in the second loop.

The sensing unit as above defined has the current conductor portions and the sensing coil loops arranged and disposed such that, when the sensing unit is connected in circuit with a current-carrying busbar, the two conductor portions of the current conductor provide effectively for increased current sensitivity whilst the dual-loop sensing coil provides for minimal sensitivity to rotational movement.

The sensing unit may be incorporated in a current sensor and, thus, the invention may be defined still further as providing a Sagnac interferometer current sensor comprising: a sensing unit as above defined, a light source, a coupler interconnecting the light source and the sensing coil and arranged to launch counter-propagating light beams into the sensing coil, and a detector for detecting phase shift between polarisation modes of the counter-propagating light beams.

The carrier in one embodiment of the sensing unit may optionally comprise first and second spaced-apart conductor members which are connectable in series with the busbar and which respectively are secured to the first and second conductor portions. Also, the first and second conductor portions may be formed as projections (for example, solid cylindrical projections) of a common plate portion of the carrier and, in this embodiment of the invention, the sensing coil may be carried between the conductor members and the common plate. Insulating gaskets may be provided between various ones of the sensing unit components so that a series circuit is formed between the first and second conductor members by way of the first (cylindrical) conductor portion, the common plate and the second (cylindrical) conductor portion. Thus, when the sensing unit is connected in an active electrical circuit, current flow will effectively be in opposite directions through the first and second conductor portions.

The light source for the current sensor as hereinbefore defined (in its various possible forms) may optionally be one that emits in a broad or a narrow band, but desirably is one that emits in a broad band. In one embodiment of the invention the light source comprises a broadband super-luminescent diode.

The invention will be more fully understood from the following drawing-related description of illustrative embodiments of a sensing coil, a sensing unit incorporating one form of the sending coil and a Sagnac interferometer current sensor incorporating the sensing coil.

DETAILED DESCRIPTION OF EXEMPLARY EMBODIMENTS OF THE INVENTION

Figure 1:
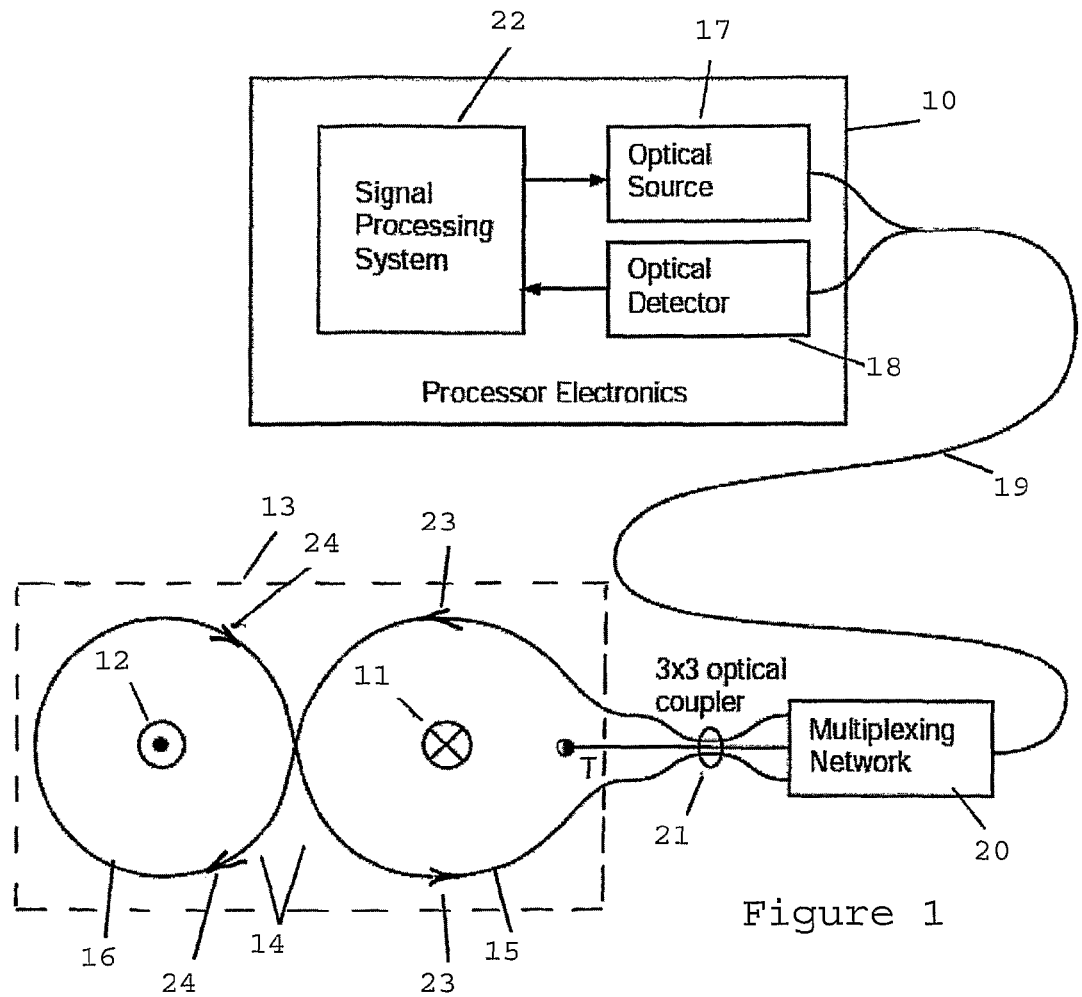
FIG. 1 shows a schematic representation of the current sensor.

As illustrated in FIG. 1, the current sensor comprises, in general, a processor 10 in which optical signals are generated, received and processed to provide a measure of sensed electrical current flow through a two-part conductor 11/12, and a sensing unit 13. One embodiment of the sensing unit 13 is to be described in more detail with reference to FIG. 5 but, in a general sense, it comprises a sensing coil 14 having two interconnected loops 15 and 16 which enclose the respective conductor portions 11 and 12. The two loops 15 and 16 of the sensing coil 14 are located substantially in a common plane, and the two conductor portions 11 and 12, which have spaced-apart parallel axes, extend orthogonally through the respective loops 15 and 16.

The sensing coil 14 is connected to an optical source 17 and to an optical detector 18 of the processor 10 by way of a length of duplex single mode optical fibre 19 and further by way of a multiplexing network 20 and a 3×3 optical coupler 21. These components 17 to 20 in their various possible forms are well known in the context of Sagnac interferometers, including Sagnac optical fibre current sensors, and, therefore, are not described herein in any detail.

However, the optical source 17 desirably is selected to comprise a super-luminescent diode which is pulsed to provide an output in the form of a series of optical pulses at a frequency of 50 to 200 kHz, with a pulse width of 100 to 200 ns. The output from the optical source 17 is launched into the multiplexing network 20, which splits the input pulses three ways, separates them in time with optical delay lines and then launches the pulses into the 3×3 coupler 21, one pulse per arm.

The multiplexing network 20 is arranged also to gather optical pulses which are returned from the sensing coil and output from the 3×3 coupler. The multiplexing network again separates the pulses in time, using delay lines, and multiplexes the pulses to provide a single (pulsed) input signal to the optical detector 18 by way of the optical fibre connection 19. The optical detector 18 converts incoming optical pulses to electronic pulses, and a signal processing system 22 is provided to determine the amplitude of each of the pulses as a measure of electrical current flowing through the conductor portions 11 and 12. The relationship between amplitude of the pulses and phase shift in polarisation modes is explained by reference to the following mathematical expressions.

As already indicated, the multiplexing network 20 splits each optical pulse from the optical source 17 into three pulses which are separated in time and launched sequentially into the arms of the 3×3 coupler 21, this producing one optical pulse output from each arm of the 3×3 coupler for each input pulse. This in turn produces nine output pulses (i.e., 3 input pulses×3 arms) which are multiplexed into the "output" fibre 19. These output pulses are represented by the term $I_{nm}$ where:

I represents intensity, n identifies the arm of the coupler into which the optical signal is launched, and m identifies the arm of the coupler from which the optical output pulse is obtained.

Thus, $I_{32}$ represents the intensity of the optical signal from arm 2 resulting from input to arm 3.

In general, these signals are approximately of the form:

$$I_{11}=I_{22}=I_{33}=A^*\cos(sJ)+b$$

$$I_{12}=I_{23}=I_{31}=A^*\cos(sJ+2\pi/3)+b$$

$$I_{21}=I_{32}=I_{13}=A^*\cos(sJ-2\pi/3)+b$$

where:
A and b are constants that are determined by the ideality of the interference (fringe visibility), optical power, electronic gain and offset, is a constant determined by the sensitivity of the current sensor in rad/amp, and
J is the current through the current sensor.

Figure 2:
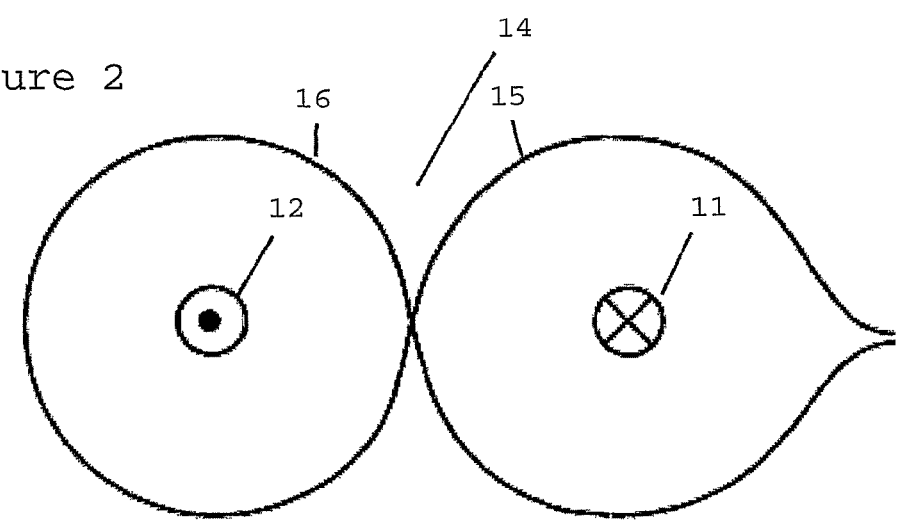
FIG. 2 shows a diagrammatic representation of one form of sensing coil for use in the current sensor.

The sensing coil 14 as shown in FIGS. 1 and 2 is wound in a figure-of-eight pattern and, thus, is formed such that light that is launched into the first loop 15 in a manner to propagate in a first direction (e.g., counter-clockwise, as indicated by arrows 23) will propagate in a second, opposite (clockwise, as indicated by arrows 24), direction in the interconnected second loop 16.

Although the loops 15 and 16 of the coil 14 are both shown, for illustrative convenience, as comprising a single turn of optical fibre; depending upon the level of sensitivity required in a given current sensor, each loop might typically comprise between 1 and 100 turns, or more for special purposes. The nominal diameter of each of the loops 15 and 16 might typically be of the order of 100 mm but, again depending upon the requirements of a given current sensor, may be as large as 600 mm or more. However, in a general sense, the number of turns in, and the area enclosed by, the loops may be different for the two loops provided that the following relationship (1) is substantially preserved:

$$N_1 \times A_1 = N_2 \times A_2, \qquad (1)$$

where—
$N_1$=number of turns in the first loop 15,
$A_1$=area enclosed by the first loop 15,
$N_2$=number of turns in the second loop 16 and
$A_2$=area enclosed by the second loop 16.

As indicated previously, the optical fibre from which the coil 14 is formed may comprise any optical fibre that provides for transmission of a single elliptical polarisation state or which is arranged in use to transmit a single elliptical polarisation state. However, it might typically comprise spun polarising fibre that incorporates boron-doped bow-tie regions to create stress birefringence.

Figure 3:
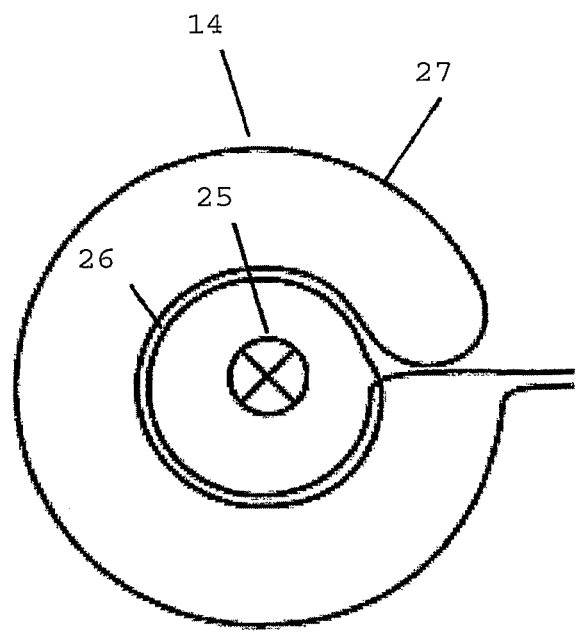
FIG. 3 shows a diagrammatic representation of a second form of sensing coil for use in the current sensor.
Figure 4:
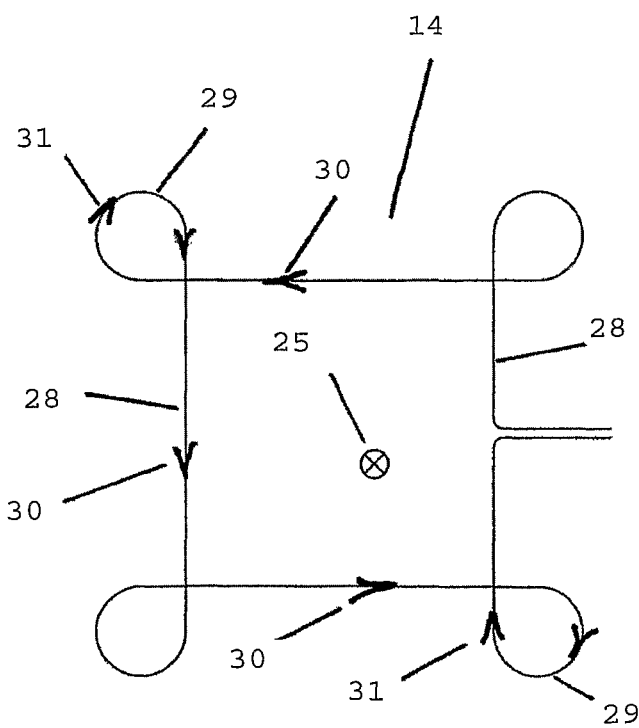
FIG. 4 shows a diagrammatic representation of a third form of sensing coil for use in the current sensor.

The figure-of-eight pattern in which the sensing coil 14 is shown to be wound in FIGS. 1 and 2 is particularly appropriate when the current conductor comprises the two portions or legs 11 and 12 through which the current is conducted (into the drawing, as illustrated, in the case of conductor portion 11 and out of the drawing in the case of conductor portion 12). However, this is but one of many possible windings and, in a case where current is conducted through a single conductor 25, as shown in FIGS. 3 and 4, the sensing coil 14 may, for example, be wound with two quasi-concentric loops 26 and 27, as shown in FIG. 3. In this case the number of turns forming, and the areas enclosed by, the two (first and second) loops would need satisfy the above mentioned relationship (1).

As a further example, the sensing coil as shown in FIG. 4 may comprise a first loop 28, that is formed to enclose the single current conductor 25, and further loops wound as interconnected sub-loops 29 located about the perimeter of the first loop 28. In this case the sensing coil will be wound in a manner such that light propagating in a first direction (e.g., counter-clockwise, as indicated by arrows 30) in the first loop will be caused to propagate in the opposite (clockwise, as indicated by arrows 31) direction in each of the sub-loops 29. Also in this case, the coil will be wound in a manner to satisfy the relationship $$N_1 \times A_1 = \Sigma(N_2 \times A_2), \qquad (2)$$

where—
$N_1$=number of turns in the first loop 28,
$A_1$=area enclosed by the first loop 28,
$N_2$=number of turns in respective ones of the sub-loops 29 and
$A_2$=area enclosed by respective ones of the sub-loops 29.

The current sensor may be constructed in various ways, depending, for example, on whether the current conductor comprises two series connected portions 11 and 12, as shown in FIGS. 1 and 2, or a single leg 25 as shown in FIGS. 3 and 4. One possible embodiment of the current sensor may incorporate a sensing unit 13, that is arranged to carry a figure-of-eight sensing coil (as illustrated in FIGS. 1 and 2), as shown in FIG. 5.

Figure 5:
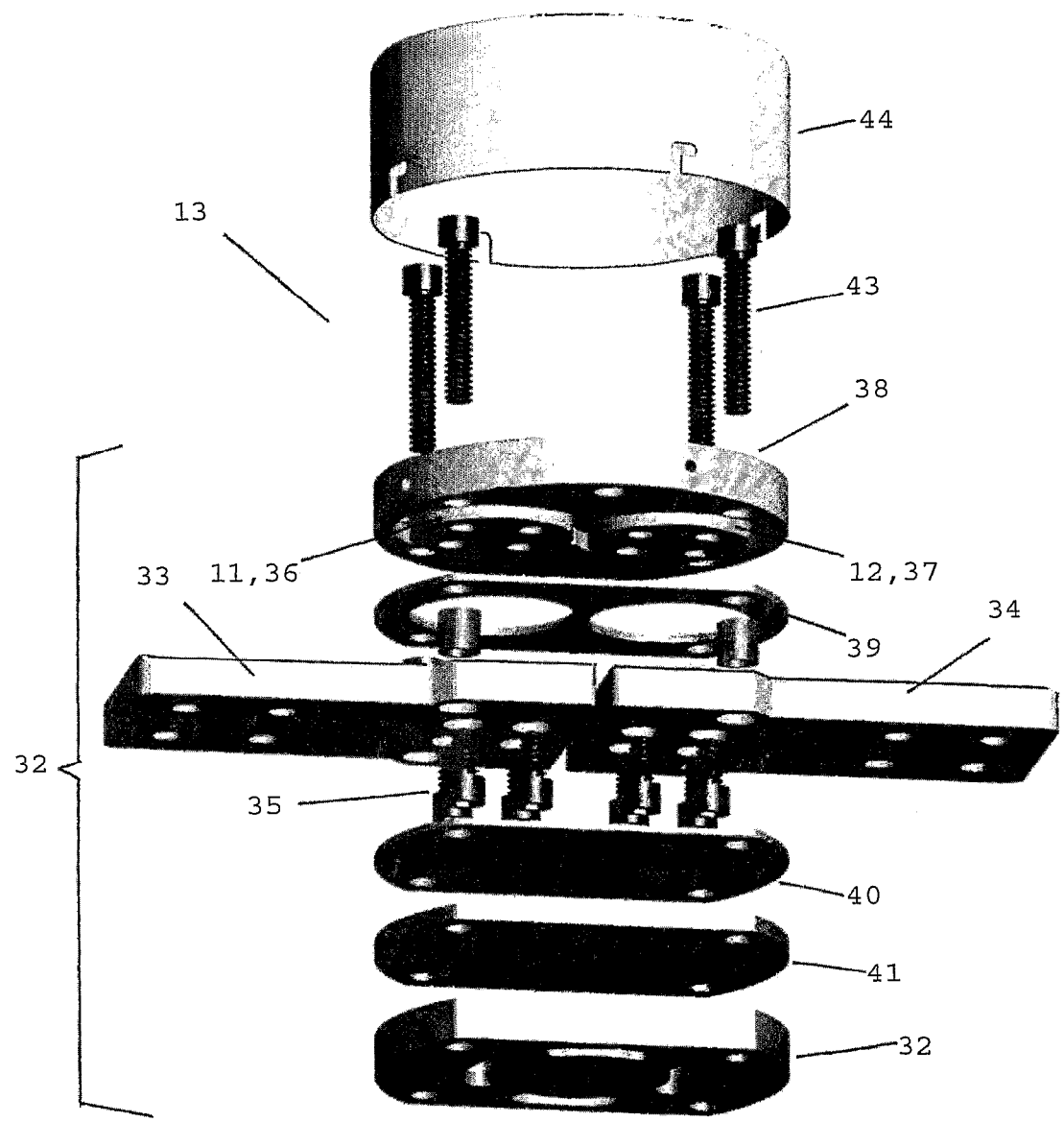
FIG. 5 shows an exploded perspective view of a sensing unit that accommodates a sensing coil of the type shown in FIG. 2.

The sensing unit 13 as shown in FIG. 5 comprises a carrier 32 for the sensing coil 14, and the carrier comprises first and second spaced-apart bar-shaped conductor members 33 and 34 which are connectable in series with a current-carrying busbar (not shown). The conductor members 33 and 34 are secured by screws 35 to the first and second conductor portions 11 and 12 and, in the illustrated embodiment, the first and second conductor portions are formed as solid cylindrical projections 36 and 37 of a common disc-shaped plate portion 38 of the carrier 32.

Although not shown in FIG. 5, the sensing coil 14 is carried between the conductor members 33, 34 and the common plate 38 and the sensing coil is positioned so that its loops 15 and 16 enclose (i.e., encircle) the cylindrical projections 36 and 37. An insulating gasket 39 is provided between the conductor members 33, 34 and the sensing coil, and a further insulating gasket 40 is provided between the conductor members 33, 34 and clamping plates 41 and 42.

Screws 43 are provided to clamp the carrier components together, and a cap 44 (through which optical fibre connections are made to the sensing coil) is removably attached to the plate portion 38 by way of bayonet connections.

With the above described sensing unit construction, a series circuit is formed between the first and second conductor members 33 and 34 by way of the first (cylindrical) conductor portion 36, the common plate 38 and the second (cylindrical) conductor portion 37. Thus, when the sensing unit is connected in series with a busbar in an active electrical circuit, current flow will effectively be in opposite directions through the first and second conductor portions 36 and 37 and the encircling loops 15 and 16 of the sensing coil.

Variations and modifications falling within the scope of the appendant claims may be made in the sensing coils, the sensing unit and the current sensor as above described.

The invention claimed is:

1. A sensing coil for a Sagnac interferometer current sensor, the sensing coil being composed of an optical fibre that is arranged in use to transmit a single elliptical polarisation state and the sensing coil comprising at least two interconnected loops, a first of the loops being arranged in use to enclose a current conductor and the loops being interconnected such that light propagating in a first direction in the first loop will propagate in a second, opposite, direction in the other or, if more than one, in at least one other loop, wherein the sensing coil is formed with two only loops and wherein the respective loops are wound with turns and enclosed areas that satisfy the relationship $N_1 \times A_1 = N_2 \times A_2$, where $N_1$=number of turns in the first loop,
$A_1$=area enclosed by the first loop,
$N_2$=number of turns in the second loop and
$A_2$=area enclosed by the second loop; and wherein both the first and the second interconnected loops are wound in opposite directions about a common axis and are arranged in use to enclose portions of a current conductor.

2. The sensing coil as claimed in claim 1 wherein the first and the second loops are formed with substantially the same number of turns and to enclose substantially equal-size areas.

3. The sensing coil as claimed in claim 1 wherein the respective loops are wound about spatially separated parallel axes.

4. The sensing coil as claimed in claim 1 wherein the first and second loops form a figure-of-eight winding with the respective loops being wound about spatially separated parallel axes.

5. The sensing coil as claimed in claim 1 wherein the respective loops lie substantially in a common plane.

6. The sensing coil as claimed in claim 1 wherein one of the two loops is wound and sized to locate within the other of the loops.

7. The sensing coil as claimed in claim 1 wherein one of the two loops is wound and sized to overlie the other of the loops.

8. The sensing coil as claimed in claim 1 wherein the optical fibre comprises a twisted birefringent optical fibre.

9. The sensing coil as claimed in claim 1 wherein the optical fibre comprises a spun birefringent optical fibre.

10. The sensing coil as claimed in claim 1 wherein the optical fibre comprises a spun bow-tie polarising fibre that has elliptical birefringence sufficiently large as to swamp linear bending birefringence.

11. A Sagnac interferometer current sensor comprising:
a sensing coil as claimed in claim 1,
a light source, a coupler interconnecting the light source and the sensing coil and arranged to launch counter-propagating light beams into the sensing coil, and a detector for detecting phase shift between polarisation modes of the counter-propagating light beams.

12. The current sensor as claimed in claim 11 wherein the sensing coil is located within sensing unit which is arranged in use to be connected in circuit with a current busbar.

13. A current sensor as claimed in claim 11 wherein the light source comprises a broadband super-luminescent diode.

14. The sensing coil as claimed in claim 1 wherein both the first and the second interconnected loops enclose portions of the current conductor.

15. A sensing unit for a Sagnac interferometer current sensor, the sensing unit being connectable in circuit with a current busbar and the sensing unit comprising:
a) a carrier having first and second conductor portions that are arranged in use to be connected in series with the current busbar, and
b) a sensing coil composed of optical fibre that is arranged in use to transmit a single elliptical polarisation state and which comprises interconnected first and second loops respectively enclosing the first and second conductor portions, the loops being interconnected such that light propagating in a first direction in the first loop will propagate in a second, opposite, direction in the second loop,
wherein the carrier comprises first and second spaced-apart conductor members which are connectable in series with the busbar and which respectively are secured to the first and second conductor portions, and
wherein the first and second conductor portions are formed as projections of a common plate portion of the carrier, and the sensing coil is carried between the conductor members and the common plate portion.

16. The sensing unit as claimed in claim 15 wherein insulating gaskets are located between the sensing unit components whereby a series circuit is formed between the first and second conductor members by way of the first conductor portion, the common plate portion and the second conductor portion, and whereby, in use of the sensing unit, current flow will effectively be in opposite directions through the first and second conductor portions.

17. A Sagnac interferometer current sensor comprising:
a sensing unit as claimed in claim 15,
a light source,
a coupler interconnecting the light source and the sensing coil and arranged to launch counter-propagating light beams into the sensing coil, and
a detector for detecting phase shift between polarisation modes of the counter-propagating light beams.

18. A current sensor as claimed in claim 17 wherein the light source comprises a broadband super-luminescent diode.

* * * * *